US009685686B2

(12) United States Patent
Zhou et al.

(10) Patent No.: US 9,685,686 B2
(45) Date of Patent: Jun. 20, 2017

(54) POWER DIVIDER AND METHOD OF FABRICATING THE SAME

(71) Applicant: Telefonaktiebolaget L M Ericsson (publ), Stockholm (SE)

(72) Inventors: Bo Zhou, Nanjing (CR); Kun Liu, Jiangsu (CN); Junyou Chen, Jiangsu (CN)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 14/436,940

(22) PCT Filed: Oct. 25, 2012

(86) PCT No.: PCT/CN2012/083477
§ 371 (c)(1),
(2) Date: Apr. 20, 2015

(87) PCT Pub. No.: WO2014/063324
PCT Pub. Date: May 1, 2014

(65) Prior Publication Data

US 2015/0270596 A1 Sep. 24, 2015

(51) Int. Cl.
*H03H 7/30* (2006.01)
*H01P 5/12* (2006.01)
(Continued)

(52) U.S. Cl.
CPC .................. *H01P 5/12* (2013.01); *H01P 5/16* (2013.01); *H01P 11/003* (2013.01); *H01P 11/006* (2013.01)

(58) Field of Classification Search
CPC .. H01P 5/12; H01P 5/16; H01P 11/003; H01P 11/006
(Continued)

(56) References Cited

U.S. PATENT DOCUMENTS 4,721,929 A * 1/1988 Schnetzer ................. H01P 5/12 333/127
5,323,138 A * 6/1994 Oki ........................ H01C 7/006 338/195

(Continued)

FOREIGN PATENT DOCUMENTS

CN 2867623 Y 2/2007
CN 201038290 Y 3/2008

(Continued)

OTHER PUBLICATIONS

PCT International Search Report, mailed Jul. 4, 2013, in connection with International Application No. PCT/CN2012/083477, all pages.

(Continued)

*Primary Examiner* — Robert Pascal
*Assistant Examiner* — Kimberly Glenn
(74) *Attorney, Agent, or Firm* — Leffler Intellectual Property Law, PLLC

(57) ABSTRACT

The invention provides a power divider, comprising: a plurality of transmission stages and a plurality of ground layers alternately arranged on respective ones of a plurality of dielectric layers, a first transmission stage being arranged on a first dielectric layer, and a last transmission stage being arranged below a last dielectric layer; wherein the plurality of transmission stages are arrayed vertically, each consisting of a loop formed by a transmission line; the first transmission stage has a first opening connected by a resistor, and each of the remaining transmission stages has the first opening connected by the resistor and a second opening without a resistor; two ends of the first opening of one of the adjacent transmission stages are connected to two ends of the second opening of the other one of the adjacent transmission stages by via transitions, in a top-to-bottom direction; and each ground layer has clearances through which (Continued)

the via transitions pass. The invention also provides a method of fabricating the power divider.

24 Claims, 3 Drawing Sheets

(51) Int. Cl.
*H01P 11/00* (2006.01)
*H01P 5/16* (2006.01)

(58) Field of Classification Search
USPC .......................................................... 333/136
See application file for complete search history.

(56) References Cited

U.S. PATENT DOCUMENTS

| | | | |
|---|---|---|---|
| 5,539,415 A | 7/1996 | Metzen et al. | |
| 5,705,962 A | 1/1998 | Fleeger et al. | |
| 6,201,439 B1 * | 3/2001 | Ishida | H01P 5/10 330/124 R |
| 6,861,923 B2 | 3/2005 | Kolehmainen et al. | |
| 7,920,035 B2 * | 4/2011 | Panaghiston | H01P 5/16 333/128 |
| 2003/0151863 A1 | 8/2003 | Ralph | |
| 2003/0227352 A1 | 12/2003 | Kolehmainen et al. | |
| 2005/0190035 A1 | 9/2005 | Wang | |
| 2007/0176707 A1 | 8/2007 | Kirkeby | |
| 2009/0295500 A1 | 12/2009 | Ives | |
| 2010/0109790 A1 | 5/2010 | Tzuang et al. | |
| 2011/0063048 A1 | 3/2011 | Floyd et al. | |
| 2012/0062335 A1 | 3/2012 | Sherrer et al. | |

FOREIGN PATENT DOCUMENTS

| | | |
|---|---|---|
| KR | 101059485 B1 | 8/2011 |
| WO | 0195425 A1 | 12/2001 |
| WO | 2005027156 A2 | 3/2005 |

OTHER PUBLICATIONS

PCT Written Opinion, mailed Jul. 4, 2013, in connection with International Application No. PCT/CN2012/083477, all pages.
Wilkinson, R. J. "An N-way hybrid power divider" IRE Transactions on Microwave Theory and Techniques, vol. MTT-8, No. 1, pp. 116-118, IEEE, Jan. 1960.
Kawai, T. et al. "Lumped-element quadrature Wilkinson power divider" Proceedings of 2009 Asia Pacific Microwave Conference, Dec. 7-10, 2009, Singapore, pp. 1012-1015, IEEE, Dec. 2009.
Elsbury, M. M. et al. "Integrated broadband lumped-element symmetrical-hybrid N-way power dividers" IEEE MTT-S International-Microwave Symposium Digest, Jun. 7-12, 2009, Boston, MA, IEEE, pp. 997-1000.,
Cho, S.-H. et al. "Wideband impedance-transforming three-port power divider using lumped elements" Microwave and Optical Technology Letters, vol. 51, No. 11, pp. 2570-2573, Wiley Periodicals, Inc., 2009.
Wong, S.W. et al. "Ultra-wideband power divider with good in-band splitting and isolation performances" IEEE Microwave and Wireless Components Letters, vol. 18, No. 8, pp. 518-520, IEEE, Aug. 2008.
Ahmed, O. et al. "A modified Wilkinson power divider/combiner for ultrawideband communications" Proceedings of IEEE Antennas and Propagation Society International Symposium, Jun. 1-5, 2009, Charleston, SC, IEEE, pp. 1-4.
Abbosh, A. M. "A compact UWB three-way power divider" IEEE Microwave and Wireless Components Letters, vol. 17, No. 8, pp. 598-600, IEEE, Aug. 2007.
Abbosh, A. M. "Ultra wideband inphase power divider for multilayer technology" IET Microwave, Antennas & Propagation, vol. 3, No. 1, pp. 148-153, IET, Feb. 2009.
Cohn, S. B. "A class of broadband three port TEM-mode hybrids" IEEE Transactions on Microwave Theory & Techniques, vol. MTT-16, No. 2, pp. 110-116, IEEE, Feb. 1968.
Jia-Chi Samuel Chieh et al., Development of a wide bandwidth Wilkinson power divider on multilayer organic substrates, Microwave and Optical Technology Letters, vol. 52, Issue 7, Jul. 2010, pp. 1606-1609.
European Search Report, mailed May 18, 2016, in connection with European Application No. EP 12887238, all pages.
English translation of Chinese Office Action issued Jun. 8, 2016 in connection with Chinese Application No. 201280076636.3, all pages.
English translation Summary of Chinese Office Action issued Jun. 8, 2016 in connection with Chinese Application No. 201280076636.3, all pages.
English translation of Chinese Office Action, issued Feb. 21, 2017, in connection with Chinese Application No. 201280076636.3, 2 pages.
Summary of Chinese Office Action, issued Feb. 21, 2017, in connection with Chinese Application No. 201280076636.3, 3 pages.
B. Zhou et al., Broadband and miniaturised LTCC quadrature hybrid using stacked multi-section structure, Electronics Letters, Feb. 16, 2012, vol. 48, No. 4, 2 pages.

* cited by examiner

POWER DIVIDER 200

POWER DIVIDER AND METHOD OF FABRICATING THE SAME

BACKGROUND OF THE INVENTION

Field of Invention

The present invention relates to a power divider in an electronic circuit, and particularly to a broadband multilayered power divider and a method of fabricating the same.

Description of Prior Art

Power dividers have very wide applications in antenna feedings, balanced amplifiers, mixers and phase shifters. Wilkinson power divider proposed in reference document [1] (R. J. Wilkinson, "An N-way hybrid power divider," *IEEE Trans. Microw. Theory Tech.*, vol. MTT-8, no. 1, pp. 116-118, January 1960) has completely matched output ports with sufficiently high isolation. Moreover, it offers equal-phase characteristics at each of its output ports. However, conventional Wilkinson power divider with quarter-wavelength branches has a narrow fractional bandwidth less than 20%, which limits its broadband applications. Approaches using lumped elements (referring to reference documents [2] T. Kawai, H. Mizuno, I. Ohta and A. Enokihara, "Lumped-element quadrature Wilkinson power divider," Proc. IEEE Asia-Pacific MIcrow. Conf., pp. 1012-1015, December 2009; [3] M. M. Elsbury, P. D. Dresselhaus, S. P. Benz and Z. Popovic, "Integrated broadband lumped-element symmetrical-hybrid N-way power dividers," *IEEE MTT-S Int. Microw Symp. Dig.*, pp. 997-1000, 2009; and [4] S.-H. Cho, C. H. Park, I.-Y. Chung and J. Jeong, "Wideband impedance-transforming three-port power divider using lumped elements," *Microw. Opt. Tech. lett.*, vol. 51, no. 11, pp. 2570-2573, 2009), open stubs (referring to reference documents [5] S. W. Wong and L. Zhu, "Ultra-wideband power divider with good in-band splitting and isolation performances," *IEEE Microw. Wireless Compon. Lett.*, vol. 18, no. 8, pp. 518-520, August 2008 and [6] 0. Ahmed and A. R. Sebak, "A modified Wilkinson power divider/combiner for ultrawideband communications," Proc. IEEE Antennas and Propagation Int.l Symp., 2009, pp. 1-4) and coupled lines (referring to reference documents [7] A. M. Abbosh, "A compact UWB three-way power divider," *IEEE Microw. Wireless Compon. Left.*, vol. 17, no. 8, pp. 598-600, August 2007 and [8] A. M. Abbosh, "Ultra wideband inphase power divider for multilayer technology," *IET Microw. Antennas Propag.*, vol. 3, iss. 1, pp. 148-153, 2009) have been proposed to enhance bandwidth. Cascaded multi-stage Wilkinson power divider proposed in reference document [9] (S. B. Cohn, "A class of broadband three port TEM-mode hybrid," *IEEE Trans. Microw. Theory Tech.*, vol. MTT-16, no. 2, pp. 110-116, February 1968) has considerably increased bandwidth and isolation between output ports, but it occupies very large circuit size due to its planar multi-stage structure, as shown in FIG. 1.

Thus, there is a desire for a broadband and miniaturized power divider.

SUMMARY OF THE INVENTION

Accordingly, a main object of the present invention is to provide a broadband and miniaturized power divider, so as to implement a size reduction.

In an aspect of the present invention, a power divider is provided. The power divider comprises: a plurality of transmission stages and a plurality of ground layers alternately arranged on respective ones of a plurality of dielectric layers, a first transmission stage being arranged on a first dielectric layer, and a last transmission stage being arranged below a last dielectric layer; wherein the plurality of transmission stages are arrayed vertically, each consisting of a loop formed by a transmission line; the first transmission stage has a first opening connected by a resistor, and each of the remaining transmission stages has the first opening connected by the resistor and a second opening without a resistor; two ends of the first opening of one of the adjacent transmission stages are connected to two ends of the second opening of the other one of the adjacent transmission stages by via transitions, in a top-to-bottom direction; and each ground layer has clearances through which the via transitions pass.

The power divider further comprises one input port and two output ports made of microstrip lines and arranged on the first dielectric layer.

In another aspect of the present invention, a method of fabricating a power divider is provided. The method comprises: placing a plurality of transmission stages on a plurality of dielectric layers respectively, each transmission stage consisting of a loop formed by a transmission line, wherein one of the transmission stages only has a first opening connected by a resistor, and each of the remaining transmission stages has the first opening connected by the resistor and a second opening without a resistor; forming via transitions at two ends of the first openings of the transmission stages; placing a plurality of ground layer with clearances on another plurality of dielectric layers respectively; alternately stacking vertically the plurality of the dielectric layers on which the transmission stages are placed and the another plurality of dielectric layers on which the ground layers with the clearances are placed, so that the transmission stage only having the first opening is arranged on a first dielectric layer and one of the remaining transmission stages is additionally arranged below a last dielectric layer; and the two ends of the first opening of one of the adjacent transmission stages are connected to two ends of the second opening of the other one of the adjacent transmission stages by the via transitions through the clearances on the ground layer, in a top-to-bottom direction; and laminating and co-firing all of the stacked dielectric layers to form a multilayered structure.

The method further comprises: forming and arranging one input port and two output ports made of microstrip lines on the first dielectric layer.

Preferably, the first and the second openings of each loop are arranged in opposite sides of the loop.

Preferably, the first transmission stage on the first dielectric layer and the last transmission stage below the last dielectric layer are made of microstrip lines, and the remaining transmission stages are made of striplines.

Preferably, the two output ports are respectively connected to the two ends of the first opening of the last transmission stage below the last dielectric layer by two via transitions throughout all the plurality of dielectric layers with clearances on all of the plurality of ground layers and two microstrip lines below the last dielectric layer, respectively.

Preferably, the resistor is buried in the dielectric layer.

Preferably, the resistor is a NiCr thin film resistor.

Preferably, all of the via transitions have same radius.

Preferably, all of the clearances have same radius.

Preferably, the transmission stages, the via transitions and the ground layers are made of metal.

Preferably, the transmission stages, the via transitions and the ground layer are made of gold.

According to the present invention, a broadband and miniaturized multilayered power divider structure may be provided. A main advantage of using the provided multilayered structure is for both size decrease and bandwidth increase, compared with conventional planar implementations. Furthermore, according to the present invention, the multilayered power divider as proposed is easier to fabricate and has a high production yield, compared to the conventional power divider structure in the prior art.

BRIEF DESCRIPTION OF THE DRAWINGS

The objects, advantages and characteristics of the present invention will be more apparent, according to descriptions of preferred embodiments in connection with the drawings, wherein.

Figure 1:
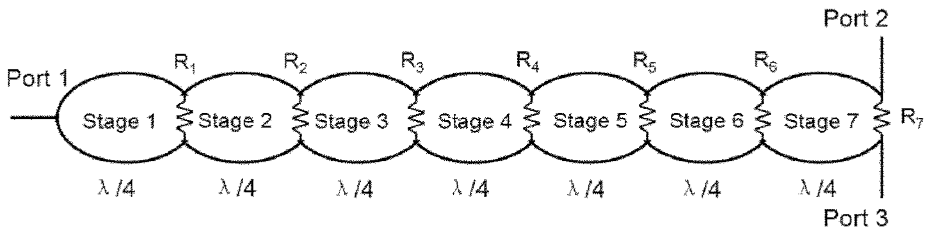
FIG. 1 illustratively shows a structure diagram of a conventional planar multi-stage power divider.

It should be noted that various parts in the drawings are not drawn to scale, but only for an illustrative purpose, and thus should not be understood as any limitations and constraints on the scope of the present invention.

DETAILED DESCRIPTION OF PREFERRED EMBODIMENTS

Hereinafter, the present invention will be further described in detail by referring to the drawings and exemplary embodiments in order to make the objects, technical scheme and advantages of the present invention more apparent. In the description, details and functions which are unnecessary to the present invention are omitted for clarity. In the exemplary embodiments, dielectric layers consisting of a substrate for fabricating a power divider may be made of LTCC Ferro-A6 material as an example. However, it should be appreciated that the exemplary embodiments are only used for illustration but not for any limitation. Other dielectric materials may also be used for the power divider of the present invention, such as LTCC DuPont 951, DuPont 943 and PCB etc.

Hereinafter, an exemplary multilayered power divider according to an embodiment of the present invention may be described in detail with reference to FIGS. 2 and 3.

Figure 2:
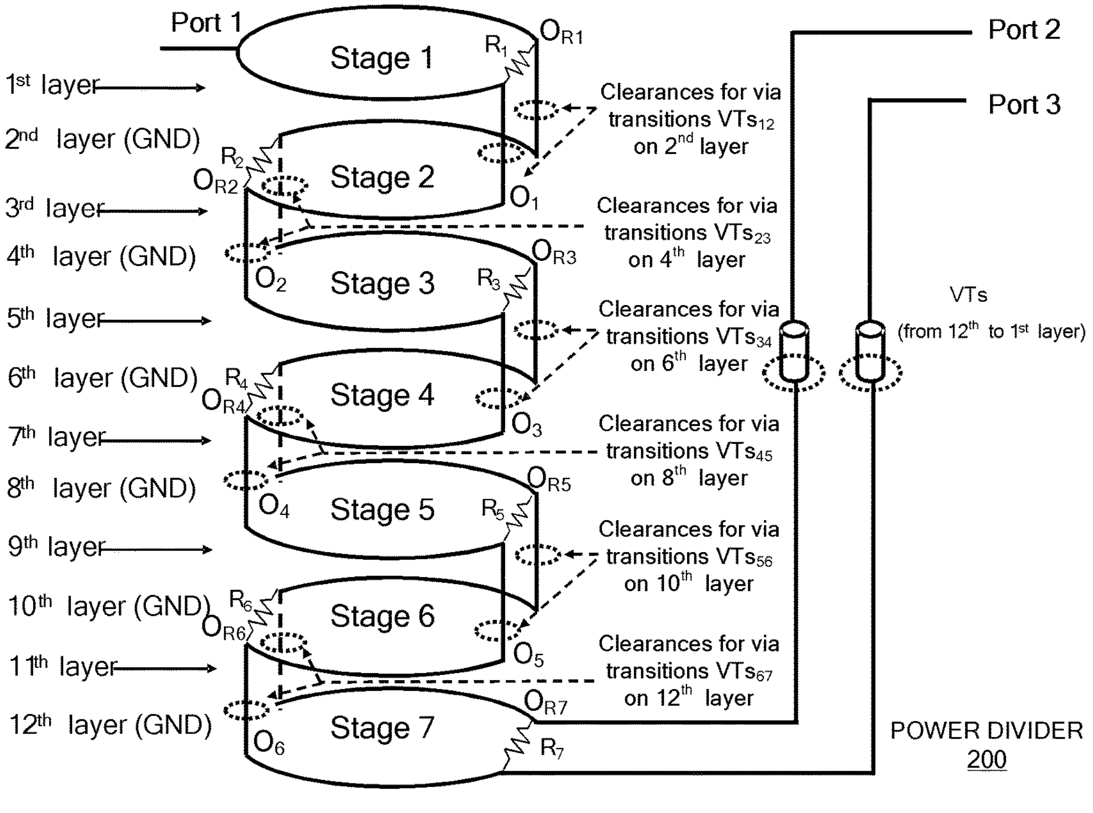
FIG. 2 illustratively shows a structure diagram of an exemplary multilayered power divider according to an embodiment of the present invention.
Figure 3:
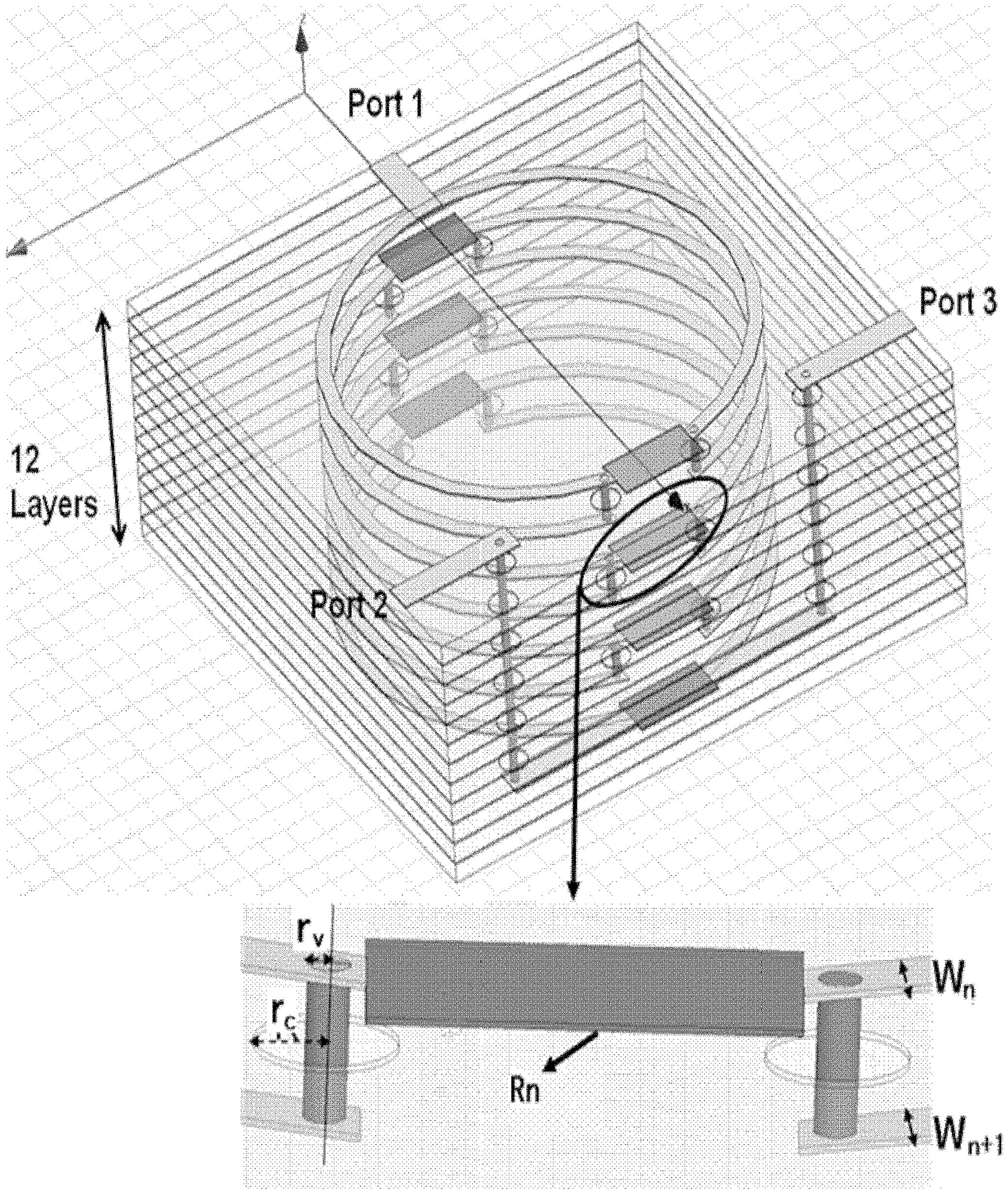
FIG. 3 illustratively shows a perspective view of an exemplary multilayered power divider according to an embodiment of the present invention.

FIG. 2 illustratively shows a structure diagram of the exemplary multilayered power divider 200, and FIG. 3 illustratively shows a perspective view of the power divider 200 in detail. As shown in FIGS. 2 and 3, the power divider 200 with multiple stages may be implemented on a multilayered LTCC substrate for e.g. 2 to 38 GHz applications, all stages are vertically cascaded by via transitions.

In this example, the multilayered power divider 200 has e.g. 12 dielectric layers. A plurality of transmission stages and a plurality of ground layers (GND) may be alternately arranged on respective ones of the 12 dielectric layers. That is, Transmission Stages 1, 2, 3, 4, 5 and 6 are arranged on odd layers, i.e., $1^{st}$, $3^{rd}$, $5^{th}$, $7^{th}$, $9^{th}$ and $11^{th}$ layers respectively. GNDs 1, 2, 3, 4, 5 and 6 are arranged on even layers, i.e., $2^{nd}$, $4^{th}$, $6^{th}$, $8^{th}$, $10^{th}$ and $12^{th}$ layers respectively. The last transmission stage, i.e., Transmission Stage 7 is arranged below the last dielectric layer, i.e., on a bottom surface of the $12^{th}$ layer.

Transmission Stage 1 on the $1^{st}$ layer and Transmission Stage 7 below the $12^{th}$ layer may be made of microstrip lines. And Transmission Stages 2-6 may be made of striplines.

The ground layers may be used to isolate coupling effect between neighboring transmission stages, so there is no parasitic coupling effect among the transmission stages on different layers.

As shown in FIG. 2, the 7 transmission stages of the power divider 200 are arrayed vertically, each consisting of a loop formed by a transmission line. Each of Transmission Stages 1-7 may have an opening $O_{R_n}$ connected by a resistor $R_n$ (n=1, 2, . . . ) for isolating output ports of each transmission stage. Preferably, the isolation resistor $R_n$ may be a NiCr thin film resistor buried in the dielectric layer.

Table 1 shows exemplary preferable designed parameters of the power divider 200 according to the exemplary embodiment of the present invention, where $W_n$ is a width of the transmission line in Transmission Stage n, and $Z_n$ is characteristic impedance of the transmission line in Transmission Stage n.

TABLE 1

| Stage n<br>n = 1, 2, . . . 7 | Characteristic Impedance $Z_n$ (Ω) | Width $W_n$ (mm) | Resistors $R_n$ (Ω) |
|---|---|---|---|
| Stage 1 | 66.00 | 0.08 | 72 |
| Stage 2 | 42.56 | 0.08 | 120 |
| Stage 3 | 36.56 | 0.11 | 241 |
| Stage 4 | 34.67 | 0.12 | 362 |
| Stage 5 | 36.75 | 0.11 | 555 |
| Stage 6 | 39.36 | 0.09 | 685 |
| Stage 7 | 50.81 | 0.14 | 791 |

As will be appreciated by the skilled in the art, $W_n$, $Z_n$ and $R_n$ may generally be selected by actual requirements. Assuming that n is the number of cascaded stages (n=1, . . . , N, and N is a positive integer lager than 1), the wider the bandwidth is required, the more stages are needed, i.e. the larger the number N is.

For example, $Z_n$ may be expressed as:

$$Z_n = e^{\left(\ln Z_{n-1} + 2^N C_{n-1}^N \ln \frac{Z_{n-1}}{Z_{n+1}}\right)};\ n = 1, 2, \ldots, N \tag{1}$$

where $Z_{n-1}$ and $Z_{n+1}$ are the characteristic impedance of previous and next stages of Stage n, respectively; and a binomial coefficient $C_n^N$ may be defined as $$C_n^N = \frac{N!}{(N-n)!n!};\ n = 0, 1, \ldots, N \tag{2}$$

And $R_n$ may be expressed as:

$$R_n = \frac{Z_n^2}{Z_{n-1}};\ n = 1, 2, \ldots, N \tag{3}$$

As is well known by the skilled in the art, $W_n$ may be derived with the above formula (1).

Cascaded adjacent transmission stages may be connected by vertical via transitions VTs. Accordingly, each of the ground layers may have clearances through which the via transitions VTs may pass.

The lower one of the adjacent transmission stages may have another opening $O_m$ (m=1, 2, . . . ) without a resistor for connecting to the opening $O_{Rn}$ by vertical via transitions VTs. Thus, the opening $O_{Rn}$ and the opening $O_m$ may be vertically arrayed with alternation. In the exemplary embodiment as shown in FIG. 2, the opening $O_{Rn}$ and the opening $O_m$ of each loop may be arranged in opposite sides of the loop of the transmission stage.

In this example, two ends of the opening $O_m$ of Transmission Stage 1 may be connected to two ends of the opening $O_1$ of Transmission Stage 2 by via transitions $VTs_{12}$; two ends of the opening $O_{R2}$ of Transmission Stage 2 may be connected to two ends of the opening $O_2$ of Transmission Stage 3 by via transitions $VTs_{23}$; two ends of the opening $O_{R3}$ of Transmission Stage 3 may be connected to two ends of the opening $O_3$ of Transmission Stage 4 by via transitions $VTs_{34}$; two ends of the opening $O_{R4}$ of Transmission Stage 4 may be connected to two ends of the opening $O_4$ of Transmission Stage 5 by via transitions $VTs_{45}$; two ends of the opening $O_{R6}$ of Transmission Stage 5 may be connected to two ends of the opening $O_5$ of Transmission Stage 6 by via transitions $VTs_{56}$; and two ends of the opening $O_{R6}$ of Transmission Stage 6 may be connected to two ends of the opening $O_6$ of Transmission Stage 7 by via transitions $VTs_{67}$.

Obviously, the numbers of the transmission stages, of the ground layers with clearances, and of the dielectric layers may be associated with each other. That is, 2(N−1) dielectric layers may have (2N−1) surfaces for alternately placing N transmission stages and (N−1) ground layers with clearances. In particular, the $n^{th}$ transmission stage may be placed on the $(2n-1)^{th}$ surface, and the $m^{th}$ ground layer with the $m^{th}$ clearances may be placed on the $(2m)^{th}$ surface, where $1 \le m \le (N-1)$, $1 \le n \le N$, and N is a positive integer lager than 1.

Thus, it should be appreciated that any number of the transmission stages may be possible. The number of the transmission stages is dependant on the bandwidth the power divider works on. The wider bandwidth, the larger the number of the transmission stages needed. In practice, the number of the transmission stages (i.e., N) may be no less than 3.

There are one input port (Port 1) and two output ports (Ports 2 and 3) made of microstrip lines and arranged on the $1^{st}$ layer. As will be appreciated by the skilled in the art, it is possible that the output ports may be arranged below the $12^{th}$ layer. However, the same layer arrangement of the input port and the output ports is easy for connection with other elements in the circuit.

The two output ports may be respectively connected to the two ends of the opening $O_{R7}$ of Transmission Stage 7 below the $12^{th}$ layer by two via transitions VTs throughout all the 12 layers with clearances on all of the plurality of ground layers and two microstrip lines below the $12^{th}$ layer, respectively.

Preferably, all of the via transitions may have same radius $r_v$, and all of the clearances may have same radius $r_c$.

Generally, the transmission stages, the via transitions and the ground layers in the present invention may be made of metal, such as gold, silver, etc.

Hereinafter, an exemplary flowchart of a method of fabricating an exemplary multilayered power divider according to an embodiment of the present invention may be described in detail with reference to FIG. 4.

Figure 4:
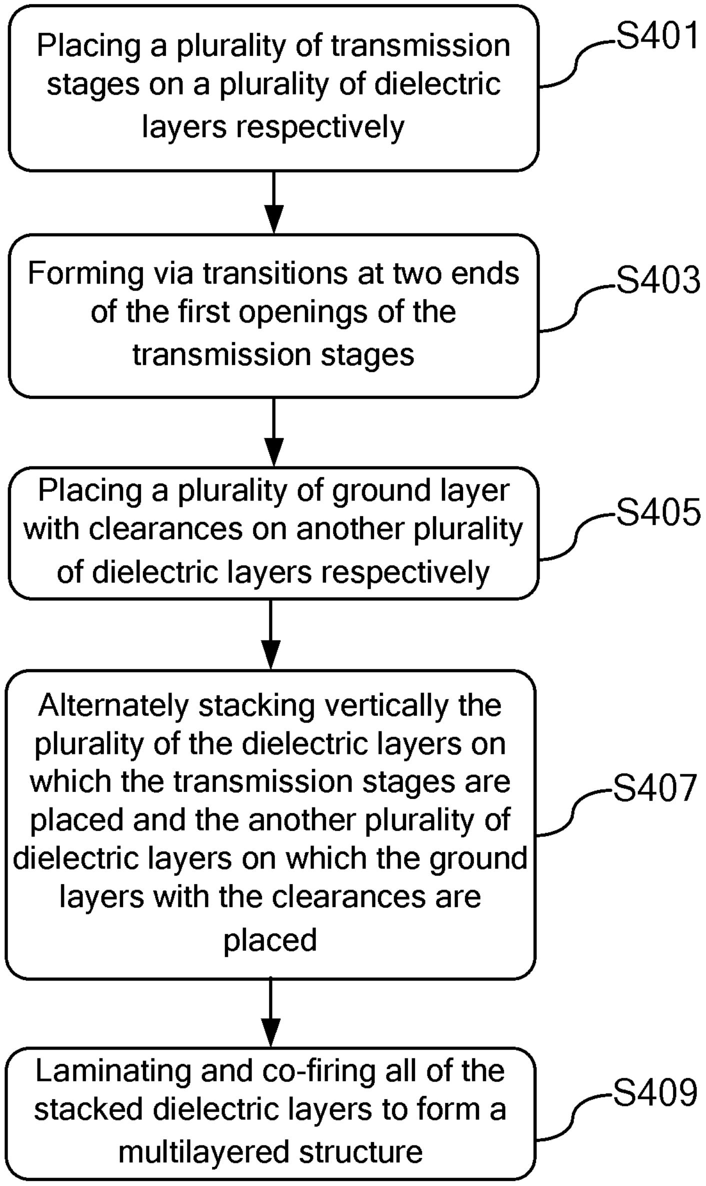
FIG. 4 shows an illustrative flowchart of a method of fabricating an exemplary multilayered power divider according to an embodiment of the present invention.

FIG. 4 shows an illustrative flowchart of a method 400 of fabricating an exemplary multilayered power divider according to an embodiment of the present invention. It should be noted that fabricating steps which are not essential to the present invention are omitted for clarity. The sequence of the steps in FIG. 4 is for illustration only but not for any limitation. As will be appreciated by the skilled in the art, some of the steps in FIG. 4 may be performed in a different order or simultaneously.

In step S401, a plurality of transmission stages may be placed on a plurality of dielectric layers respectively. Each transmission stage may consist of a loop formed by a transmission line, wherein one of the transmission stages may only have a opening $O_R$ connected by a resistor R for isolating output ports of each transmission stage. As previously mentioned, the isolation resistor R may preferably be a NiCr thin film resistor buried in the dielectric layer. Each of the remaining transmission stages may have the opening $O_R$ connected by the resistor R and another opening O without a resistor for connecting to the opening $O_R$ by vertical via transitions VTs.

In step S403, via transitions VTs may be formed at two ends of the openings $O_R$ of the transmission stages.

In step S405, a plurality of ground layer with clearances may be placed on another plurality of dielectric layers respectively.

In step S407, the plurality of the dielectric layers on which the transmission stages are placed and the another plurality of dielectric layers on which the ground layers with the clearances are placed may be alternately stacked vertically, so that the transmission stage only having the opening $O_R$ may be arranged on a first dielectric layer and one of the remaining transmission stages may be additionally arranged below a last dielectric layer; and the two ends of the opening $O_R$ of one of the adjacent transmission stages may be connected to two ends of the opening O of the other one of the adjacent transmission stages by the via transitions VTs through the clearances on the ground layer, in a top-to-bottom direction.

Preferably, the opening $O_R$ and the opening O of each loop may be arranged in opposite sides of the loop of the transmission stage. The locations of the openings $O_R$ and O may be determined accurately by coordinates in the dielectric layers during the fabrication process.

In step S409, all of the stacked dielectric layers may be laminated and co-fired to form a multilayered structure of the power divider.

Preferably, the transmission stage on the first dielectric layer and the transmission stage below the last dielectric layer may be made of microstrip lines, and the remaining transmission stages may be made of striplines.

The method 400 may further comprise a step of forming and arranging one input port and two output ports made of microstrip lines on the first dielectric layer (not shown). The two output ports may be respectively connected to the two ends of the opening $O_R$ of the transmission stage below the last dielectric layer by two via transitions VTs throughout all the plurality of dielectric layers with clearances on all of the plurality of ground layers and two microstrip lines below the last dielectric layer, respectively.

Preferably, all of the via transitions may have same radius $r_v$, and all of the clearances may have same radius $r_c$.

Generally, the transmission stages, the via transitions and the ground layers in the present invention may be made of metal, such as gold, silver, etc.

By adopting the vertically stacked 7-stage structure cascaded by via transitions as proposed in the present invention, a fractional bandwidth of 180% and a size reduction of 84.6% may be achieved, compared with an equivalent planar implementation.

The above is only the preferred embodiments of the present invention and the present invention is not limited to the above embodiments. Therefore, any modifications, substitutions and improvements to the present invention are possible without departing from the spirit and scope of the present invention.

What is claimed is:

1. A power divider, comprising:

a number, N−1, of transmission stages and a number, N−1, of ground layers alternately arranged on respective ones of a plurality, 2(N−1), of dielectric layers, wherein N is an integer greater than 1, wherein a first one of the transmission stages is arranged on a first one of the dielectric layers, wherein the transmission stages are arrayed vertically, each consisting of a loop formed by a transmission line; each of the transmission stages has a respective first opening connected by a respective resistor, and all but the first transmission stages has a respective second opening without a respective resistor;

wherein the power divider further comprises a last transmission stage arranged below a last one of the dielectric layers, wherein the last transmission stage is formed by a transmission line having a last first opening connected by a last resistor, and a last second opening without a last resistor, wherein adjacent transmission stages of the N−1 and last transmission stages are connected such that two ends of the first opening of one of the adjacent transmission stages are connected to two ends of the second opening of the other one of the adjacent transmission stages by via transitions, in a top-to-bottom direction; and each of the ground layers has clearances through which the via transitions pass.

2. The power divider of claim 1, wherein the first and the second openings of each of the loops are arranged in opposite sides of the loop.

3. The power divider of claim 1, wherein the first transmission stage on the first dielectric layer and the last transmission stage below the last dielectric layer are made of microstrip lines, and the remaining transmission stages are made of striplines.

4. The power divider of claim 1, further comprising: one input port and two output ports made of microstrip lines and arranged on the first dielectric layer.

5. The power divider of claim 4, wherein the two output ports are respectively connected to the two ends of the last first opening of the last transmission stage below the last dielectric layer by two via transitions throughout all the plurality of dielectric layers with clearances on all of the ground layers and two microstrip lines below the last dielectric layer, respectively.

6. The power divider of claim 1, wherein at least one of the resistors is buried in a respective one of the dielectric layers.

7. The power divider of claim 1, wherein at least one of the resistors is a NiCr thin film resistor.

8. The power divider of claim 1, wherein all of the via transitions have same radius.

9. The power divider of claim 1, wherein all of the clearances have same radius.

10. The power divider according to claim 1, wherein the transmission stages, the via transitions and the ground layers are made of metal.

11. The power divider according to claim 10, wherein the transmission stages, the via transitions and the ground layer are made of gold.

12. The power divider of claim 1, further comprising:

two output ports arranged below the last one of the dielectric layers.

13. A method of fabricating a power divider, comprising:

placing a plurality of transmission stages on a plurality of dielectric layers respectively, each of the plurality of transmission stages consisting of a loop formed by a transmission line, wherein one of the transmission stages only has a first opening connected by a resistor, and each of the remaining transmission stages has a respective first opening connected by a respective resistor and a respective second opening without a respective resistor;

forming via transitions at two ends of the first openings of the transmission stages;

placing a plurality of ground layers with clearances on another plurality of dielectric layers respectively;

alternately stacking vertically the plurality of the dielectric layers on which the transmission stages are placed and the another plurality of dielectric layers on which the ground layers with the clearances are placed, so that the transmission stage only having the first opening is arranged on a first one of the dielectric layers and one of the remaining transmission stages is additionally arranged below a last one of the dielectric layers; and wherein adjacent transmission stages of the plurality of transmission stages are connected such that the two ends of the first opening of one of the adjacent transmission stages are connected to two ends of the second opening of the other one of the adjacent transmission stages by the via transitions through the clearances on the ground layer between the one of the adjacent transmission stages and the other one of the adjacent transmission stages, in a top-to-bottom direction; and laminating and co-firing all of the stacked dielectric layers to form a multilayered structure.

14. The method of claim 13, wherein the first and the second openings of each of the loops are arranged in opposite sides of the loop.

15. The method of claim 13, wherein the transmission stage on the first one of the dielectric layers and the transmission stage below the last one of the dielectric layers are made of microstrip lines, and the remaining transmission stages are made of striplines.

16. The method of claim 13, further comprising:

forming and arranging one input port and two output ports made of microstrip lines on the first one of the dielectric layers.

17. The method of claim 16, wherein the two output ports are respectively connected to the two ends of the first opening of the transmission stage below the last one of the dielectric layers by two via transitions throughout all the plurality of dielectric layers with clearances on all of the plurality of ground layers and two microstrip lines below the last one of the dielectric layers, respectively.

18. The method of claim 13, wherein at least one of the resistors is buried in a respective one of the dielectric layers.

19. The method of claim 13, wherein at least one of the resistors is a NiCr thin film resistor.

20. The method of claim 13, wherein all of the via transitions have same radius.

21. The method of claim 13, wherein all of clearances have same radius.

22. The method according to claim 13, wherein the transmission line stages, the via transitions and the ground layers are made of metal.

23. The method according to claim 22, wherein the transmission stages, the via transitions and the ground layer are made of gold.

24. The method of claim 13, further comprising:

forming and arranging two output ports below the last one of the dielectric layers.

* * * * *